(12) United States Patent
Chaffins et al.

(10) Patent No.: US 11,064,572 B2
(45) Date of Patent: Jul. 13, 2021

(54) 3-DIMENSIONAL PRINTED HEATER

(71) Applicant: Hewlett-Packard Development Company, L.P., Houston, TX (US)

(72) Inventors: Sterling Chaffins, Corvallis, OR (US); Cassady Sparks Roop, Corvallis, OR (US); Kevin P. DeKam, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 262 days.

(21) Appl. No.: 16/073,163

(22) PCT Filed: Jun. 17, 2016

(86) PCT No.: PCT/US2016/038196
§ 371 (c)(1),
(2) Date: Jul. 26, 2018

(87) PCT Pub. No.: WO2017/180169
PCT Pub. Date: Oct. 19, 2017

(65) Prior Publication Data
US 2019/0037646 A1    Jan. 31, 2019

Related U.S. Application Data

(63) Continuation of application No. PCT/US2016/027970, filed on Apr. 15, 2016.

(51) Int. Cl.
*H05B 1/02*    (2006.01)
*H05B 3/14*    (2006.01)
(Continued)

(52) U.S. Cl.
CPC .......... *H05B 3/146* (2013.01); *B29C 64/165* (2017.08); *B29C 64/209* (2017.08);
(Continued)

(58) Field of Classification Search
CPC .. H05B 3/346; H05B 3/145; H05B 2203/003; H05B 2203/013; H05B 2203/017;
(Continued)

(56) References Cited

U.S. PATENT DOCUMENTS 6,363,606 B1   4/2002   Johnson et al.
7,553,512 B2   6/2009   Kodas et al.
(Continued)

FOREIGN PATENT DOCUMENTS

CH     1950192 A    4/2007
CN     1056393 A    11/1991
(Continued)

*Primary Examiner* — Mark H Paschall
(74) *Attorney, Agent, or Firm* — HPI Patent Development

(57) ABSTRACT

According to an example, a three-dimensional (3D) printed heater may include a part body formed of fused thermoplastic polymer particles and an electrically resistive element formed of a matrix of conductive particles interspersed between a matrix of thermoplastic polymer particles. The conductive particles and the thermoplastic polymer particles may be provided at respective densities to cause the electrically resistive element to have a predetermined resistance level. The 3D printed heater may also include electrical contacts connected to the electrically resistive element, in which a current is to be applied through the electrically resistive element via the electrical contacts to cause the electrically resistive element to generate a predefined level of heat.

11 Claims, 5 Drawing Sheets

(51) Int. Cl.

| | | |
|---|---|---|
| *G01B 1/00* | (2006.01) | |
| *G01B 7/16* | (2006.01) | |
| *B29C 64/165* | (2017.01) | |
| *B29C 64/218* | (2017.01) | |
| *G01L 1/22* | (2006.01) | |
| *B29C 64/209* | (2017.01) | |
| *B33Y 10/00* | (2015.01) | |
| *B33Y 30/00* | (2015.01) | |
| *B33Y 80/00* | (2015.01) | |
| *B29K 101/12* | (2006.01) | |
| *C09D 11/037* | (2014.01) | |

(52) U.S. Cl.
CPC .............. *B29C 64/218* (2017.08); *G01B 1/00* (2013.01); *G01B 7/18* (2013.01); *G01L 1/2293* (2013.01); *H05B 3/145* (2013.01); *B29K 2101/12* (2013.01); *B33Y 10/00* (2014.12); *B33Y 30/00* (2014.12); *B33Y 80/00* (2014.12); *C09D 11/037* (2013.01); *H05B 2203/003* (2013.01); *H05B 2203/013* (2013.01); *H05B 2203/017* (2013.01)

(58) Field of Classification Search
CPC ... B29C 64/209; B29C 64/165; B29C 64/218; B23Y 10/00; B23Y 30/00; B23Y 80/00; B29K 2101/12; G01B 1/00; G01B 7/18; G01L 1/2293
USPC .................................. 219/553, 504, 505, 494
See application file for complete search history.

(56) References Cited

U.S. PATENT DOCUMENTS

| | | | |
|---|---|---|---|
| 7,987,589 B2 | 8/2011 | Huang et al. | |
| 8,481,902 B2 | 7/2013 | Leboeuf et al. | |
| 9,228,859 B2 | 1/2016 | Ranky et al. | |
| 2004/0224173 A1* | 11/2004 | Boyd | C08J 5/18 428/500 |
| 2007/0238056 A1 | 10/2007 | Baumann et al. | |
| 2007/0241482 A1 | 10/2007 | Giller et al. | |
| 2010/0326976 A1* | 12/2010 | Nakajima | H05B 3/34 219/217 |
| 2011/0240200 A1* | 10/2011 | Korya | B29C 66/131 156/60 |
| 2013/0079693 A1 | 3/2013 | Ranky et al. | |
| 2013/0089642 A1* | 4/2013 | Lipson | B29C 64/209 426/115 |
| 2013/0320467 A1 | 12/2013 | Buchanan et al. | |
| 2014/0238153 A1 | 8/2014 | Wood et al. | |
| 2014/0257549 A1* | 9/2014 | Swartz | B33Y 50/00 700/119 |
| 2014/0268607 A1 | 9/2014 | Wicker et al. | |
| 2015/0109006 A1 | 4/2015 | Choi et al. | |
| 2019/0184629 A1* | 6/2019 | Kerrigan | A43B 13/14 |

FOREIGN PATENT DOCUMENTS

| | | |
|---|---|---|
| CN | 101932429 A | 12/2010 |
| EP | 2001656 | 10/2014 |
| EP | 2001656 B1 | 10/2014 |
| EP | 2963995 | 1/2016 |
| JP | 63226901 | 9/1988 |
| JP | H06176857 | 6/1994 |
| JP | 2001153735 | 6/2001 |
| WO | WO-2014209994 A2 | 12/2014 |
| WO | WO-2015082179 A1 | 6/2015 |
| WO | WO-2015165884 | 11/2015 |
| WO | WO-2015178980 | 11/2015 |
| WO | WO-2015193045 | 12/2015 |

\* cited by examiner

500

```
┌─────────────────────────────────────────┐
│ DISPENSING A CONDUCTIVE FUSING AGENT    │
│ CONTAINING CONDUCTIVE PARTICLES ONTO    │
│ SELECTED FIRST AREAS OF A LAYER OF      │
│ THERMOPLASTIC POLYMER PARTICLES         │
│ 510                                     │
└─────────────────────────────────────────┘
                    │
                    ▼
┌─────────────────────────────────────────┐
│ DISPENSING A SECOND FUSING AGENT ONTO   │
│ SELECTED SECOND AREAS OF THE LAYER OF   │
│ THERMOPLASTIC POLYMER PARTICLES, WHEREIN│
│ THE SECOND FUSING AGENT INCLUDES A FUSING│
│ MATERIAL THAT IS TO ABSORB ELECTROMAGNETIC│
│ RADIATION TO PRODUCE HEAT               │
│ 520                                     │
└─────────────────────────────────────────┘
                    │
                    ▼
┌─────────────────────────────────────────┐
│ FUSING THE FIRST AREAS AND THE SECOND AREAS│
│ WITH ELECTROMAGNETIC RADIATION TO FORM AN│
│ ELECTRICALLY RESISTIVE ELEMENT IN THE FIRST│
│ AREAS AND A PART BODY IN THE SECOND AREAS,│
│ WHEREIN THE ELECTRICALLY RESISTIVE ELEMENT│
│ IS COMPOSED OF A MATRIX OF CONDUCTIVE    │
│ PARTICLES INTERLOCKED WITH A MATRIX OF   │
│ FUSED THERMOPLASTIC POLYMER PARTICLES AND│
│ THE PART BODY INCLUDES FUSED             │
│ THERMOPLASTIC POLYMER PARTICLES, AND     │
│ WHEREIN THE ELECTRICALLY RESISTIVE ELEMENT│
│ IS TO GENERATE A PREDEFINED LEVEL OF HEAT│
│ WHEN AN INPUT VOLTAGE IS APPLIED ACROSS THE│
│ ELECTRICALLY RESISTIVE ELEMENT          │
│ 530                                     │
└─────────────────────────────────────────┘
```

FIG. 5

3-DIMENSIONAL PRINTED HEATER

BACKGROUND

In three-dimensional (3D) printing, an additive printing process is often used to make three-dimensional solid parts from a digital model. 3D printing is often used in rapid product prototyping, mold generation, mold master generation, and short run manufacturing. Some 3D printing techniques are considered additive processes because they involve the application of successive layers of material. This is unlike traditional machining processes, which often rely upon the removal of material to create the final part. 3D printing often requires curing or fusing of the building material, which for some materials may be accomplished using heat-assisted extrusion, melting, or sintering, and for other materials may be accomplished using digital light projection technology.

BRIEF DESCRIPTION OF THE DRAWINGS

FIG. 5 depicts a flow chart of an example method of fabricating a 3D printed heater part in accordance with examples of the present disclosure.

Figure 1:
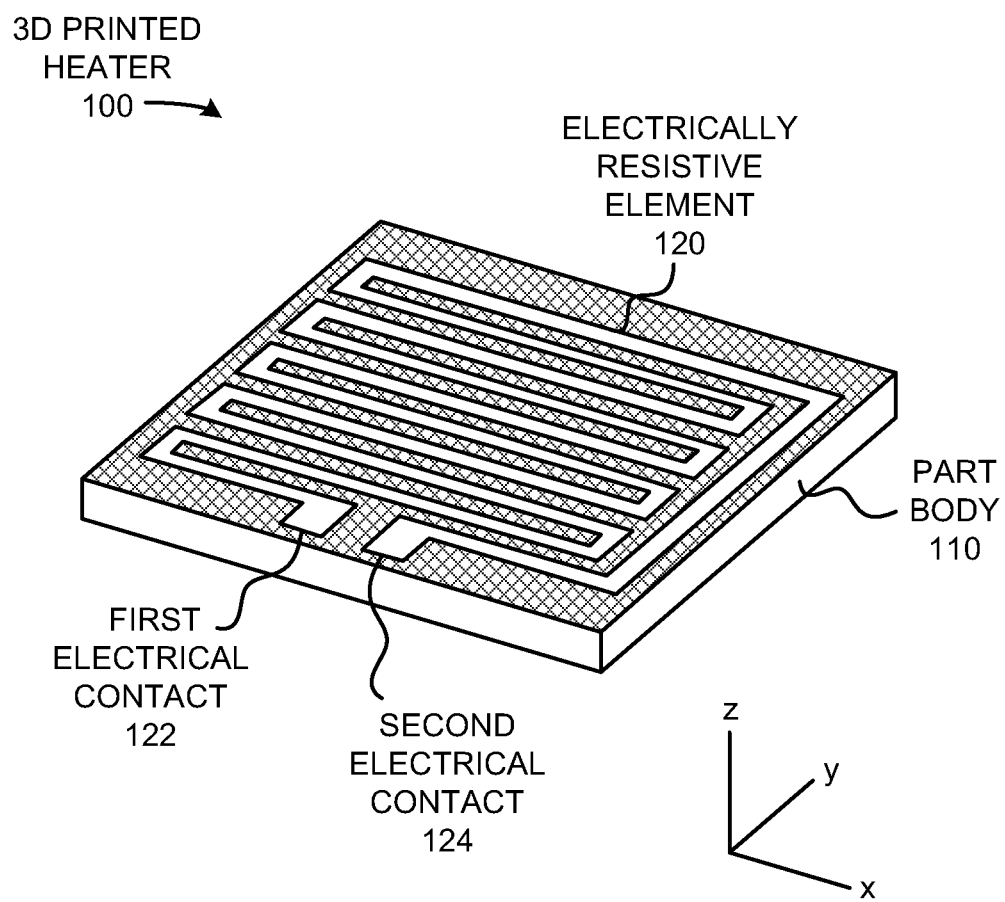
FIG. 1 represents a simplified perspective view of a 3D printed heater in accordance with examples of the present disclosure.

The figures depict several examples of the presently disclosed technology. However, it should be understood that the present technology is not limited to the examples depicted.

DETAILED DESCRIPTION

The present disclosure is drawn to heating devices and 3-dimensional (3D) printing. More specifically, the present disclosure provides 3D printed heaters, a method of fabricating 3D printed heaters with an integrated electrically resistive element, and a heating device containing a 3D printed heater and a voltage source.

The 3D printed heaters described herein may have a part body formed of fused thermoplastic polymer particles and an electrically resistive element. The electrically resistive element may be separately formed of a matrix of conductive particles interlocked with a matrix of fused thermoplastic polymer particles. Electrical contacts may be connected to the electrically resistive element, such that a current may be applied through the electrically resistive element via a first electrical contact and a second electrical contact. Further, the particles of the electrically resistive element, e.g., the conductive particles and the thermoplastic polymer particles may be continuously fused to the particles of the part body.

In some examples, the electrically resistive element may be formed on a surface of the printed part body. In other examples, the electrically resistive element may be embedded in the part body and a plurality of electrical contacts of the electrically resistive element may be formed on and/or extend to a surface of the printed part body. In some particular examples, the resistance of the electrically resistive element may vary on an application-by-application basis. By way particular example, the resistance may range from anywhere between about 1 ohm to about 50 kilohms. For instance, small electrically resistive elements may have a practical lower limit on resistance, below which their dissipation will be sufficiently high that they will melt. However, a physically larger electrically resistive element may use the same resistance and may have the same heat dissipation spread over a larger area. The resistance for an electrically resistive element may depend upon the system voltage and the desired heat power output.

In one specific example, the conductive particles may include elemental transition metal particles selected from the group consisting of silver particles, copper particles, gold particles, and combinations thereof. In some examples, the fused thermoplastic polymer particles may include a fusing agent selected from carbon black, a near-infrared absorbing dye, a near infrared absorbing pigment, a tungsten bronze, a molybdenum bronze, metal nanoparticles, a conjugated polymer, or combinations thereof. In additional examples, the electrically resistive element may further include an activating agent in the matrix of conductive particles, the matrix of fused thermoplastic polymer particles, or both. In further examples, the part body is formed of multiple layers of fused thermoplastic polymer particles stacked in a z-axis direction, and the electrically resistive element is oriented at least partially in the z-axis direction.

A method of fabricating a 3D printed heater having an electrically resistive element is also described herein. The method may include dispensing a conductive fusing agent onto selected first areas of a layer of thermoplastic polymer particles, in which the conductive fusing agent may include conductive particles. The method may also include dispensing a second fusing agent onto selected second areas of the layer of thermoplastic polymer particles, in which the second fusing agent may include fusing material to absorb electromagnetic radiation to produce heat. Additionally, the method may include fusing the first areas and the second areas with electromagnetic radiation to form an electrically resistive element in the first areas and a part body in the second areas. The electrically resistive element is composed of a matrix of conductive particles interlocked with a matrix of fused thermoplastic polymer particles, and the part body includes fused thermoplastic polymer particles. In addition, the electrically resistive element is to generate a predefined level of heat when an input voltage is applied across the electrically resistive element. Moreover, the particles of the electrically resistive element may be continuously fused to the particles of the part body.

In some examples, the electrically resistive element is formed at least partially oriented in a z-axis direction such that the electrically resistive element extends across multiple layers of the 3D printed heater. In some examples, a plurality of electrically resistive elements is formed across multiple layers of the 3D printed heater. In some examples, an activating agent for the conductive particles in the conductive fusing agent may be applied prior to or following application of the conductive fusing agent.

A heating device is also described herein. The heating device may include a part body formed of fused thermoplastic polymer and an electrically resistive element formed of a matrix of thermoplastic polymer particles interlocked with a matrix of conductive particles, in which the electrically resistive element is embedded within the part body and has a predetermined resistance level. The heating device may also include a voltage source to apply an input voltage across the electrically resistive element, in which the input voltage is to cause the electrically resistive element to generate (or equivalently, dissipate) a predefined level of heat.

With this general overview in mind, FIG. 1 illustrates a simplified perspective view of an example 3D printed heater 100. The 3D printed heater 100 may include a part body 110 and an electrically resistive element 120. The electrically resistive element 120 may include a first electrical contact 122 and a second electrical 124. That is, the first electrical contact 122 may connect to a first end of the electrically resistive element 120 and the second electrical contact 124 may connect to a second end of the electrically resistive element 120. The electrically resistive element 120 may be integrally formed with the part body 110. As illustrated in FIG. 1, the electrically resistive element 120 may be integrally formed on a surface of the part body 110. Although not shown, the electrically resistive element 120 may extend in the negative z direction into a portion of the part body 110.

Figure 2A:
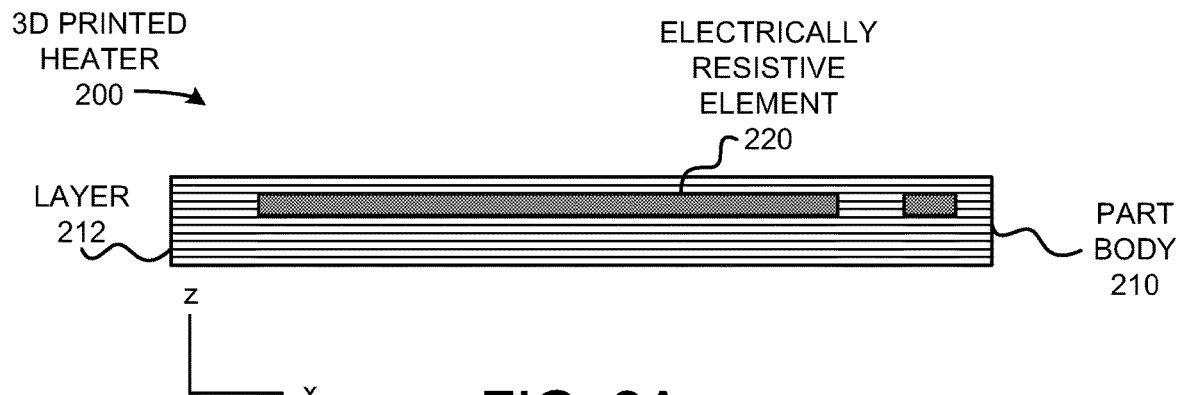
FIG. 2A represents a cross-sectional side view of a 3D printed heater in accordance with an example of the present disclosure.
Figure 2B:
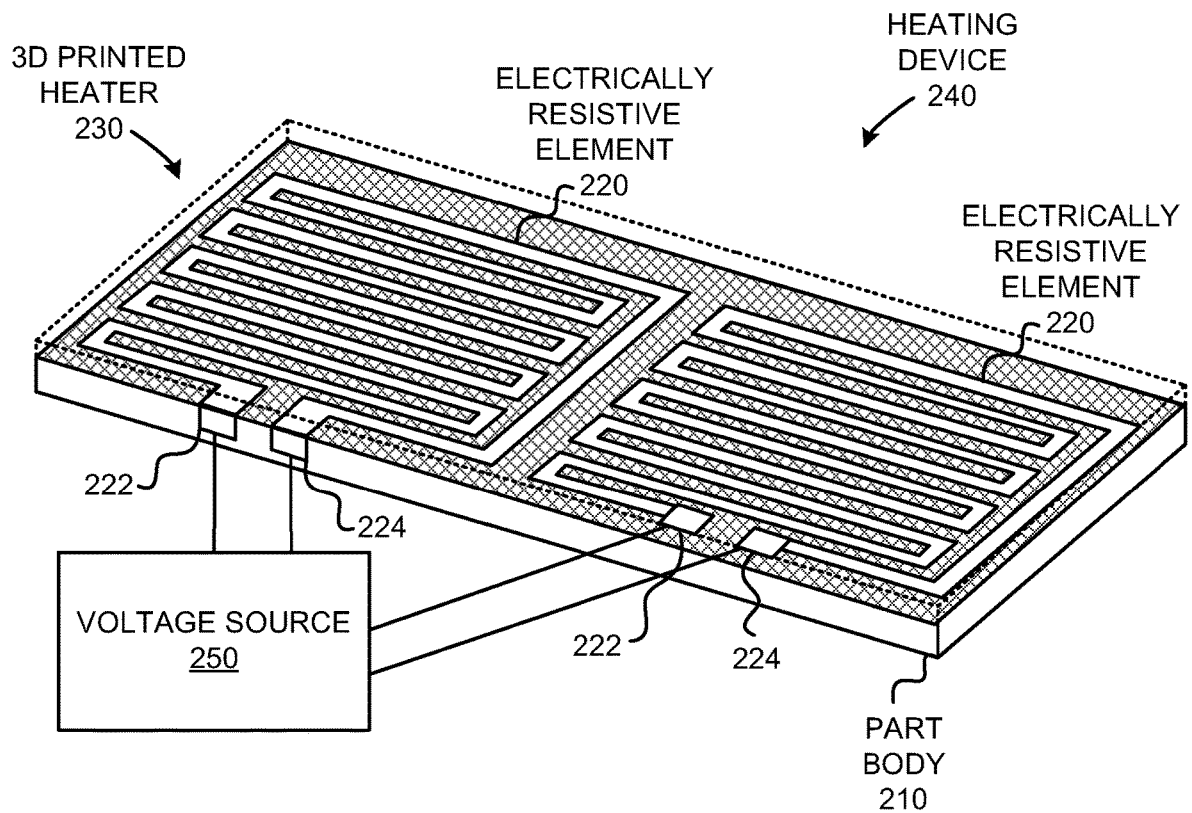
FIG. 2B represents a simplified perspective view of a 3D printed heater in accordance with other examples of the present disclosure.

However, FIGS. 2A and 2B illustrate alternative examples of 3D printed heaters 200, 230. In FIG. 2A, the 3D printed heater 200 is depicted as including an electrically resistive element 220 that is embedded within a part body 210. The 3D printed heater 200 is also depicted as being formed of a plurality of layers 212 that are stacked on top of each other. That is, for instance, the part body 210 may be formed by forming the layers 212 from the bottom up, i.e., in the z-direction.

In FIG. 2B, the 3D printed heater 230 is depicted as being part of a heating device 240, which may also include a voltage source (or equivalently, power source) 250. As shown, the 3D printed heater 230 may include multiple electrically resistive elements 220 embedded within a part body 210. The portion of the part body 210 provided above the electrically resistive elements 220 has been shown in outline so that the electrically resistive elements 220 may be more readily visible. In this regard, it should be understood that the electrically resistive elements 220 may be embedded within the part body 210 as shown in FIG. 2A. To facilitate electrical contact with the electrically resistive elements 220, each of the electrically resistive elements 220 may respectively be connected to a first electrical contact 222 and a second electrical contact 224. As shown, the first and second electrical contacts 222, 224 may extend to an outer surface of the part body 210, e.g., a side surface and/or a top surface. In other examples, the first and second electrical contacts 222, 224 may extend to or be formed on a bottom surface of the part body 210.

While FIG. 2B illustrates each of the electrically resistive elements 220 having respective electrical contacts 222, 224, in other examples, not all of the electrically resistive elements 220 may include electrical contacts. Instead, some of the electrically resistive elements 220 may be embedded in the part body 210 to function as heat sinks or to otherwise direct heat flow as desired across the part body 210. In addition or alternatively, an embedded electrically resistive element 220 may include electrical contacts 222, 224 that are connected to another electrically resistive element 220. In some cases, where embedded connections are made between the electrically resistive elements 220, the number of electrical connections extending to the surface of the part body 210 may be reduced, such as by half. This may reduce the need for external wiring to interconnect the electrically resistive elements 220 in a 3D printed heater 230.

In any regard, the voltage source 250 may be electrically connected to the electrical contacts 222, 224 and may apply a voltage through the electrically resistive elements 220 via the electrical contacts 222, 224. According to an example, the electrically resistive elements 220 may be formed to have a predetermined resistance level such that the electrically resistive elements 220 generate a predefined amount of heat when the voltage source 250 applies a predefined level of voltage through the electrically resistive elements 220. The voltage source 250 may apply voltage at a set level or the level may be varied, for instance, to vary the amount of heat generated by the electrically resistive elements 220.

Figure 3:
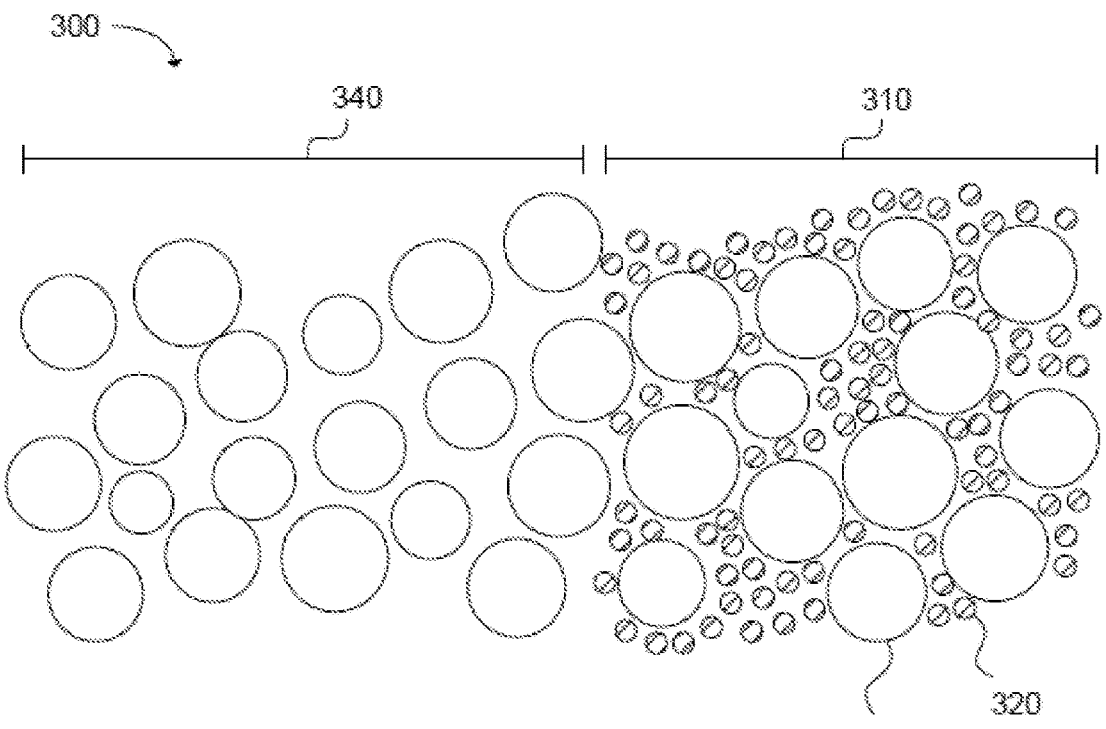
FIG. 3 represents a layer of composite material prior to fusing, which can be used to prepare a 3-dimensional printed heater part in accordance with examples of the present disclosure.

Each of the electrically resistive elements 120, 220 shown in FIGS. 1, 2A, and 2B may be separately formed of conductive particles interlocked in a matrix of thermoplastic polymer particles. An example of the conductive composite material making up each of the electrically resistive elements 120, 220 is shown in more detail in FIGS. 3-4. As shown in FIG. 3, each of the electrically resistive elements 120, 220 may be formed from thermoplastic polymer particles 330 and conductive particles 320. In one example of a method of making a 3D printed heater 100, 200, 230, a layer 300 of thermoplastic polymer particles can be spread in a powder bed of a 3-dimensional printer (not shown). The layer 300 may be equivalent to a layer 212 depicted in FIG. 2A.

Individual areas, such as a first selected area 310, of the layer 300 can be printed with a conductive fusing agent containing conductive particles. The conductive particles can be capable of absorbing energy from electromagnetic radiation and converting the energy to heat. A second selected area 340 can be printed with a second fusing agent that is capable of absorbing energy from electromagnetic radiation and converting the energy to heat. The layer 300 of thermoplastic polymer particles can then be exposed to electromagnetic radiation to raise the temperature of the layer 300, causing the polymer particles and the conductive particles to fuse together.

Figure 4:
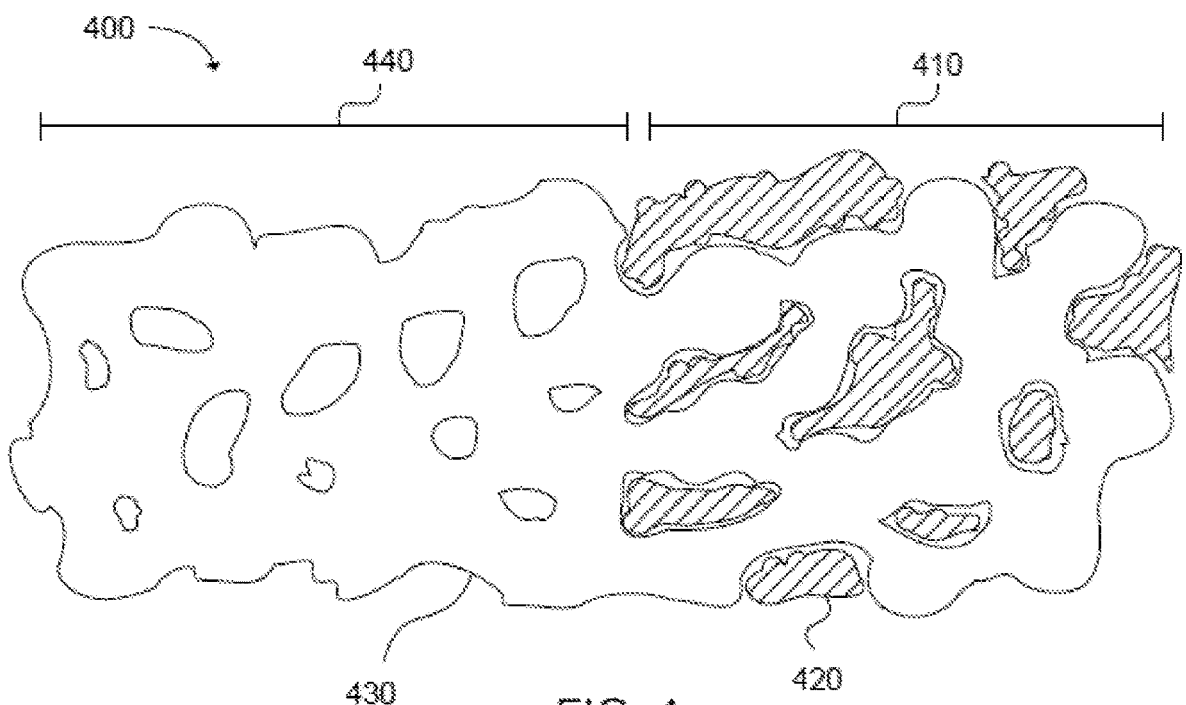
FIG. 4 represents a layer of composite material after fusing, which can be used to prepare a 3-dimensional printed heater in accordance with examples of the present disclosure.

FIG. 4 shows an example of the layer 400 after fusing. As shown, the polymer particles may fuse together to form a matrix of fused thermoplastic polymer particles 430, and the conductive particles may fuse or sinter together to form a matrix of conductive particles 420. The matrix of fused thermoplastic polymer particles and the matrix of conductive particles may be interlocked, forming a conductive composite. Additionally, the conductive composite may be present only in the first selected area 410 where the conductive fusing agent was printed, and not in the second selected area 440 where the second fusing agent was printed.

It should be noted that these figures are not necessarily drawn to scale, and the relative sizes of polymer particles and conductive particles can differ from those shown. For example, in many cases the conductive particles can be much smaller than the polymer particles, which may be polymer powder particles, such as 2-3 orders of magnitude smaller.

It should also be noted that FIG. 4 shows only a 2-dimensional cross-section of a single layer of the conductive composite. Although the conductive particles appear to be in isolated locations in the figure, the matrix of fused or sintered conductive particles can be a continuously connected matrix in three dimensions. Thus, the conductive composite 410 can have good electrical conductivity through the matrix of conductive particles. However, while the conductive composite 420/430 may have a higher level of electrical conductivity than the fused thermoplastic polymer particles 430, the conductive composite 420/430 may be formed to have a predetermined resistance level. According to an example, the predetermined resistance level may be a resistance level that enables the conductive composite 420/430 to generate a predefined level of heat for a predefined input voltage.

Further, multiple layers of the conductive composite 420/430 can be formed such that the conductive composite 420/430 can have good electrical conductivity across multiple layers of the conductive composite (i.e., in the z-axis direction). Thus, in some examples, one or more of a plurality of electrically resistive elements 220 can be oriented at least partially in the z-axis direction such that the one or more electrically resistive elements 120, 220 extend across multiple layers of the 3D printed heater 100, 200, 230, for instance, as shown in FIG. 2A. Additionally, because the 3D printed heater 230 may have a plurality of electrically resistive elements 220, each of the individual electrically resistive elements 220 can be formed across the same multiple layers or across different multiple layers. For example, a first set of the plurality of electrically resistive elements 220 can be formed exclusively across a number of upper layers of the 3D printed heater 230.

In contrast, a second set of the plurality of electrically resistive elements 220 can be formed exclusively across a number of lower layers of the 3D printed heater 230 such that there is no layer overlap between the two sets. In other examples, the second set of electrically resistive elements 220 can be formed across some layers in which the first set of electrically resistive elements 220 is formed and some layers in which the first set of electrically resistive elements 220 is not formed. In other examples, the second set of electrically resistive elements 220 can be formed across the same layers as the first set of electrically resistive elements 220, but also additional layers in which the first set of electrically resistive elements 220 is not formed. Therefore, so long as the first set and the second set of electrically resistive elements 220 are not formed exclusively across the same layers of the 3D printed heater 230, the first set of electrically resistive elements 220 is formed across different layers than the second set of electrically resistive elements 220. It should be noted that a set of electrically resistive elements 220 can include 1, 2, or more electrically resistive elements 220.

The conductive particles used to form the electrically resistive elements 120, 220 can include any suitable 3D printable conductive particles. For example, the conductive particles can include electrically conductive polymers, metals, carbon allotropes, the like, and combinations thereof. Carbon allotropes can include single-walled carbon nanotubes, multi-walled carbon nanotubes, graphene, buckyballs, graphite, carbon black, etc., and combinations thereof.

In some specific examples, the conductive fusing agent can include a transition metal. In some examples, the transition metal can be in the form of elemental transition metal particles. The elemental transition metal particles can include, for example, silver particles, copper particles, gold particles, platinum particles, palladium particles, chromium particles, nickel particles, zinc particles, or combinations thereof. The particles can also include alloys of more than one transition metal, such as Au—Ag, Ag—Cu, Ag—Ni, Au—Cu, Au—Ni, Au—Ag—Cu, or Au—Ag—Pd.

In certain examples, other non-transition metals can be included in addition to the transition metal. The non-transition metals can include lead, tin, bismuth, indium, gallium, and others. In some examples, soldering alloys can be included. The soldering alloys can include alloys of lead, tin, bismuth, indium, zinc, gallium, silver, and copper, in various combinations. In certain examples, such soldering alloys can be printed in locations that are to be used as soldering connections for printed electrical components. The soldering alloys can be formulated to have low melting temperatures useful for soldering, such as less than 230° C.

In further examples, the elemental transition metal particles can be nanoparticles having an average particle size from 10 nm to 200 nm. In more specific examples, the elemental transition metal particles can have an average particle size from 30 nm to 70 nm.

As metal particles are reduced in size, the temperature at which the particles are capable of being sintered can also be reduced. Therefore, using elemental transition metal nanoparticles in the conductive fusing agent can allow the particles to sinter and form a conductive matrix of sintered nanoparticles at relatively low temperatures. For example, the elemental transition metal particles in the conductive fusing agent can be capable of being sintered at or below the temperature reached during curing in the 3-dimensional printing process. In a further example, the thermoplastic polymer powder bed can be heated to a preheat temperature during the printing process, and the elemental transition metal particles can be capable of being sintered at or below the preheat temperature. In still further examples, the elemental transition metal particles can be capable of being sintered at a temperature from 20° C. to 350° C. As used herein, the temperature at which the elemental transition metal particles are capable of being sintered refers to the lowest temperature at which the particles will become sintered together, forming a conductive matrix of sintered particles. It is understood that temperatures above this lowest temperature will also cause the particles to become sintered.

In additional examples of the conductive fusing agent, the transition metal can be in the form of elemental transition metal particles that are stabilized by a dispersing agent at surfaces of the particles. The dispersing agent can include ligands that passivate the surface of the particles. Suitable ligands can include a moiety that binds to the transition metal. Examples of such moieties can include sulfonic acid, phosphonic acid, carboxylic acid, dithiocarboxylic acid, phosphonate, sulfonate, thiol, carboxylate, dithiocarboxylate, amine, and others. In some cases, the dispersing agent can contain an alkyl group having from 3-20 carbon atoms, with one of the above moieties at an end of the alkyl chain. In certain examples, the dispersing agent can be an alkylamine, alkylthiol, or combinations thereof. In further examples, the dispersing agent can be a polymeric dispersing agent, such as polyvinylpyrrolidone (PVP), polyvinylalcohol (PVA), polymethylvinylether, poly(acrylic acid) (PAA), nonionic surfactants, polymeric chelating agents, and others. The dispersing agent can bind to the surfaces of the elemental transition metal particles through chemical and/or physical attachment. Chemical bonding can include a covalent bond, hydrogen bond, coordination complex bond, ionic bond, or combinations thereof. Physical attachment can include attachment through van der Waal's forces, dipole-dipole interactions, or a combination thereof.

In further examples, the conductive fusing agent can include a transition metal in the form of a metal salt or metal oxide. Under certain conditions, a transition metal salt or metal oxide in the conductive fusing agent can form elemental transition metal particles in situ after being printed onto the thermoplastic polymer powder bed. The elemental transition metal particles thus formed can then be sintered together to form a conductive matrix. In some examples, a reducing agent can be reacted with the metal salt or metal oxide to produce elemental metal particles. In one example, a reducing agent can be underprinted onto the powder bed before the conductive fusing agent. In another example, a reducing agent can be overprinted over the conductive fusing agent. In either case, the reducing agent can be reacted with the metal salt or metal oxide to form elemental metal particles before the thermoplastic polymer particle layer is cured. Suitable reducing agents can include, for example, glucose, fructose, maltose, maltodextrin, trisodium citrate, ascorbic acid, sodium borohydride, ethylene glycol, 1,5-pentanediol, 1,2-propylene glycol, and others.

In other examples, the conductive fusing agent can include a conductive polymer. Non-limiting examples of conductive polymers can include poly(3,4-ethylenedioxythiophene) (PEDOT), polyaniline (PANI), polythiophene, 30 polypyrrole, etc., or a combination thereof. The level of conductivity of a conductive polymer can depend on the level of doping or oxidation of the conductive polymer. Thus, while many conductive polymers are used as semiconductors, they can be doped with conductive materials to increase their conductivity. Further, conductive polymers with low water solubility can be further functionalized with hydrophilic moieties to increase their water solubility. Thus, a large variety of conductive polymers, or combinations thereof, can be employed as conductive particles.

The concentration of conductive particles in the conductive fusing agent can vary. However, higher conductive particle concentrations can tend to provide better conductivity due to a larger amount of conductive material being deposited on the powder bed. In some examples, the conductive fusing agent can contain from about 5 wt % to about 50 wt % of conductive particles, with respect to the entire weight of the conductive fusing agent. In further examples, the conductive fusing agent can contain from about 10 wt % to about 30 wt % of conductive particles, with respect to the entire weight of the conductive fusing agent.

In some examples, an activating agent can be used with the conductive fusing agent. A variety of activating agents can be used with the conductive fusing agent. For example, activating agents can include halogen salts, acids, bases, various solvents, and combinations thereof. In one specific example, where the conductive fusing agent includes a transition metal, the activating agent can include a halogen salt, such as sodium chloride, potassium chloride, potassium bromide, or potassium iodide, for example. The halogen salt can react with dispersing agents at the surfaces of transition metal particles to remove the dispersing agents from the particles. This can increase the sintering between the metal particles and improve the conductivity of the matrix formed of the sintered particles. The activating agent can be dispensed onto the powder bed before the conductive fusing agent. When the conductive fusing agent is printed over the activating agent, the transition metal particles can come into contact with the halogen salt in the activating agent. In alternate examples, the polymer powder can be pretreated with a halogen salt before being used in the 3-dimensional printing system. When the conductive fusing agent is printed onto the powder bed, the transition metal particles in the conductive fusing agent can come into contact with the halogen salt already present on the powder.

As one specific alternative example of an activating agent, the conductive polymer PEDOT can be activated with polystyrenesulfonate (PSS) or other suitable activating agent. Other conductive polymers can be activated with a variety of dopants, such as carbon allotropes, acids, bases, and the like. All such activating agents are considered within the scope of the current disclosure.

The conductive particles can be interlocked with a matrix of thermoplastic polymer particles. The thermoplastic polymer particles also form the main body of the 3D printed heater. The thermoplastic polymer powder can include powder particles with an average particle size from 20 µm to 100 µm. As used herein, "average" with respect to properties of particles refers to a number average unless otherwise specified. Accordingly, "average particle size" refers to a number average particle size. Additionally, "particle size" refers to the diameter of spherical particles, or to the longest dimension of non-spherical particles.

In certain examples, the polymer particles can have a variety of shapes, such as substantially spherical particles or irregularly-shaped particles. In some examples, the polymer powder can be capable of being formed into 3D printed parts with a resolution of 20 to 100 microns. As used herein, "resolution" refers to the size of the smallest feature that can be formed on a 3D printed part. The polymer powder can form layers from about 20 to about 100 microns thick, allowing the fused layers of the printed part to have roughly the same thickness. This can provide a resolution in the z-axis direction of about 20 to about 100 microns. The polymer powder can also have a sufficiently small particle size and sufficiently regular particle shape to provide about 20 to about 100 micron resolution along the x-axis and y-axis.

In some examples, the thermoplastic polymer powder can be colorless. For example, the polymer powder can have a white, translucent, or transparent appearance. When used with a colorless fusing agent, such polymer powders can provide a printed part that is white, translucent, or transparent. In other examples, the polymer powder can be colored for producing colored parts. In still other examples, when the polymer powder is white, translucent, or transparent, color can be imparted to the part by the fusing agent or another colored fusing agent.

The thermoplastic polymer powder can have a melting or softening point from about 70° C. to about 350° C. In further examples, the polymer can have a melting or softening point from about 150° C. to about 200° C. A variety of thermoplastic polymers with melting points or softening points in these ranges can be used. For example, the polymer powder can be selected from the group consisting of nylon 6 powder, nylon 9 powder, nylon 11 powder, nylon 12 powder, nylon 66 powder, nylon 612 powder, polyethylene powder, thermoplastic polyurethane powder, polypropylene powder, polyester powder, polycarbonate powder, polyether ketone powder, polyacrylate powder, polystyrene powder, and mixtures thereof. In a specific example, the polymer powder can be nylon 12, which can have a melting point from about 175° C. to about 200° C. In another specific example, the polymer powder can be thermoplastic polyurethane.

The thermoplastic polymer particles can also in some cases be blended with a filler. The filler can include inorganic particles such as alumina, silica, or combinations thereof. When the thermoplastic polymer particles fuse together, the filler particles can become embedded in the polymer, forming a composite material. In some examples, the filler can include a free-flow agent, anti-caking agent, or the like. Such agents can prevent packing of the powder particles, coat the powder particles and smooth edges to reduce inter-particle friction, and/or absorb moisture. In some examples, a weight ratio of thermoplastic polymer particles to filler particles can be from 10:1 to 1:2 or from 5:1 to 1:1.

A second fusing agent can be added to the thermoplastic polymer particles to form a matrix of fused thermoplastic polymer particles upon exposure to a specified wavelength and/or sufficient intensity of electromagnetic radiation. In some examples, the second fusing agent can be devoid or substantially devoid of the conductive particles contained in the conductive fusing agent. Thus, the second fusing agent can provide a lower conductivity than the conductive fusing agent when printed on the thermoplastic polymer powder. However, in some examples the second fusing agent can include metal particles that provide a lower conductivity than the conductive particles in the conductive fusing agent. For example, the second fusing agent can include metal particles with passivated surfaces that do not sinter together to form a conductive matrix.

The second fusing agent can contain a fusing material that is capable of absorbing electromagnetic radiation to produce heat. The fusing material can be colored or colorless. In various examples, the fusing material can be carbon black, near-infrared absorbing dyes, near-infrared absorbing pigments, tungsten bronzes, molybdenum bronzes, metal nanoparticles, or combinations thereof. Examples of near-infrared absorbing dyes include aminium dyes, tetraaryldiamine dyes, cyanine dyes, pthalocyanine dyes, dithiolene dyes, and others. In further examples, the fusing material can be a near-infrared absorbing conjugated polymer such as poly(3, 4-ethylenedioxythiophene)-poly(styrenesulfonate) (PEDOT: PSS), a polythiophene, poly(p-phenylenesulfide), a polyaniline, a poly(pyrrole), a poly(acetylene), poly(p-phenylenevinylene), polyparaphenylene, or combinations thereof. As used herein, "conjugated" refers to alternating double and single bonds between atoms in a molecule. Thus, "conjugated polymer" refers to a polymer that has a backbone with alternating double and single bonds. In many cases, the fusing material can have a peak absorption wavelength in the range of 800 nm to 1400 nm.

The amount of fusing material in the second fusing agent can vary depending on the type of fusing material. In some examples, the concentration of fusing material in the second fusing agent can be from 0.1 wt % to 20 wt %. In one example, the concentration of fusing material in the second fusing agent can be from 0.1 wt % to 15 wt %. In another example, the concentration can be from 0.1 wt % to 8 wt %. In yet another example, the concentration can be from 0.5 wt % to 2 wt %. In a particular example, the concentration can be from 0.5 wt % to 1.2 wt %.

In some examples, the fusing material can have a black or gray color due to the use of carbon black as the fusing material. However, in other examples the fusing material can be colorless or nearly colorless. The concentration of the fusing material can be adjusted to provide a fusing material in which the visible color of the second fusing agent is not substantially altered by the fusing material. Although some of the above described fusing materials have low absorbance in the visible light range, the absorbance is usually greater than zero. Therefore, the fusing materials can typically absorb some visible light, but their color in the visible spectrum can minimal enough that it does not substantially impact the second fusing agent's ability to take on another color when a colorant is added (unlike carbon black which dominates the second fusing agent's color with gray or black tones). The fusing materials in concentrated form can have a visible color, but the concentration of the fusing materials in the second fusing agent can be adjusted so that the fusing materials are not present in such high amounts that they alter the visible color of the second fusing agent. For example, a fusing material with a very low absorbance of visible light wavelengths can be included in greater concentrations compared to a fusing material with a relatively higher absorbance of visible light. These concentrations can be adjusted based on a specific application with some experimentation.

In further examples, the concentration of the fusing material can be high enough that the fusing material impacts the color of the fusing material, but low enough that when the second fusing agent is printed on the thermoplastic polymer powder, the fusing material does not impact the color of the powder. The concentration of the fusing material can be balanced with the amount of second fusing agent that is to be printed on the polymer powder so that the total amount of fusing material that is printed onto the polymer powder is low enough that the visible color of the polymer powder is not impacted. In one example, the fusing material can have a concentration in the second fusing agent such that after the second fusing agent is printed onto the polymer powder, the amount of fusing material in the polymer powder is from 0.0003 wt % to 5 wt % with respect to the weight of the polymer powder.

The fusing material can have a temperature boosting capacity sufficient to increase the temperature of the polymer powder above the melting or softening point of the polymer powder. As used herein, "temperature boosting capacity" refers to the ability of a fusing material to convert near-infrared light energy into thermal energy to increase the temperature of the printed polymer powder over and above the temperature of the unprinted portion of the polymer powder. Typically, the polymer powder particles can be fused together when the temperature increases to the melting or softening temperature of the polymer. As used herein, "melting point" refers to the temperature at which a polymer transitions from a crystalline phase to a pliable, amorphous phase. Some polymers do not have a melting point, but rather have a range of temperatures over which the polymers soften. This range can be segregated into a lower softening range, a middle softening range and an upper softening range. In the lower and middle softening ranges, the particles can coalesce to form a part while the remaining polymer powder remains loose. If the upper softening range is used, the whole powder bed can become a cake. The "softening point," as used herein, refers to the temperature at which the polymer particles coalesce while the remaining powder remains separate and loose. When the second fusing agent is printed on a portion of the polymer powder, the fusing material can heat the printed portion to a temperature at or above the melting or softening point, while the unprinted portions of the polymer powder remain below the melting or softening point. This allows the formation of a solid 3D printed part, while the loose powder can be easily separated from the finished printed part.

Although melting point and softening point are often described herein as the temperatures for coalescing the polymer powder, in some cases the polymer particles can coalesce together at temperatures slightly below the melting point or softening point. Therefore, as used herein "melting point" and "softening point" can include temperatures slightly lower, such as up to about 20° C. lower, than the actual melting point or softening point.

In one example, the fusing material can have a temperature boosting capacity from about 10° C. to about 70° C. for a polymer with a melting or softening point from about 100°

C. to about 350° C. If the powder bed is at a temperature within about 10° C. to about 70° C. of the melting or softening point, then such a fusing material can boost the temperature of the printed powder up to the melting or softening point, while the unprinted powder remains at a lower temperature. In some examples, the powder bed can be preheated to a temperature from about 10° C. to about 70° C. lower than the melting or softening point of the polymer. The second fusing agent can then be printed onto the powder and the powder bed can be irradiated with a near-infrared light to coalesce the printed portion of the powder.

In some examples of the present technology, the conductive fusing agent and the second fusing agent can be balanced so that thermoplastic polymer powder that is printed with the conductive fusing agent and the second fusing agent reach nearly the same temperature when exposed to light during curing. The type and amount of fusing material in the second fusing agent can be selected to match the temperature boosting capacity of the conductive particles in the conductive fusing agent. The type and amount of conductive particles in the conductive fusing agent can also be adjusted to match the temperature boosting capacity of the fusing material in the second fusing agent. Additionally, in some examples the conductive fusing agent can also contain a fusing material in addition to the conductive particles, which can be the same fusing material or a different fusing material as that used in the second fusing agent. In certain examples, the conductive fusing agent and the second fusing agent can raise the temperature of the thermoplastic polymer powder to temperatures within 30° C., within 20° C., or within 10° C. of each other during curing.

In further examples, colored fluid agents can also be used for adding color to the thermoplastic polymer powder. This can allow for printing of full-color 3-dimensional parts. In one example, the cyan, magenta, yellow, and black inks can be used in addition to the conductive fusing agent, second fusing agent, and activating agent if present. Alternatively, any of the above described agents can also include a pigment or dye colorant that imparts a visible color to the agents.

Each of the conductive fusing agent, activating agent, second fusing agent, and additional colored agents can be formulated for use in an ink jet printer. The conductive particles and fusing materials can be stable in an ink jet ink vehicle and the agents can provide good ink jetting performance. In some examples, the conductive particles and fusing materials can be water-soluble, water-dispersible, organic-soluble, or organic-dispersible. The conductive particles and fusing materials can also be compatible with the thermoplastic polymer powder so that jetting the agents onto the polymer powder provides adequate coverage and interfiltration of the conductive particles and fusing materials into the powder.

Besides the conductive particles, fusing materials, colorants, and other ingredients described above, the agents can also include a liquid vehicle. In some examples, the liquid vehicle formulation can include water, one or more cosolvents, one or more non-ionic, cationic, and/or anionic surfactant, dispersants, biocides, viscosity modifiers, materials for pH adjustment, sequestering agents, preservatives, the like, or combinations thereof.

Various methods of making 3D printed heaters can use any of the materials described above in any suitable combination. FIG. 5 depicts a flowchart of an example of a method 500 of fabricating a 3D printed heater having an electrically resistive element. The method 500 may include dispensing a dispensing a conductive fusing agent containing conductive particles onto selected first areas of a layer of thermoplastic polymer particles 510. The method 500 may also include dispensing a second fusing agent onto selected second areas of the layer of thermoplastic polymer particles, wherein the second fusing agent incudes a fusing material that is to absorb electromagnetic radiation to produce heat 520. The method 530 may further include fusing the first areas and the second areas with electromagnetic radiation to form an electrically resistive element in the first areas and a part body in the second areas, in which the electrically resistive element is composed of a matrix of conductive particles interlocked with a matrix of fused thermoplastic polymer particles and the part body comprises fused thermoplastic polymer particles, and in which the electrically resistive element is to generate a predefined level of heat when an input voltage is applied across the electrically resistive element 530.

In further examples, methods of making 3D printed heaters having electrically resistive elements can include dispensing additional agents onto the thermoplastic polymer particles. In some examples, the fusing agents, and other agents described herein, can be dispensed by ink jetting. This can be performed by a thermal ink jet printing system or a piezo ink jet printing system. Any other suitable method of dispensing the agents onto the polymer particles can also be used.

In additional examples, the methods described herein can be performed using a powder bed 3-dimensional printing system. In one example, the bed of the thermoplastic polymer particles can be formed by introducing polymer powder from a polymer powder supply and rolling the powder in a thin layer using a roller. The conductive fusing agent and second fusing agent can be jetted using ink jet print heads. The amount of conductive fusing agent printed can be calibrated based on the concentration of conductive particles in the conductive fusing agent, the temperature boosting capacity of the conductive particles, the desired conductivity of the resulting conductive composite material to be printed, among other factors. Similarly, the amount of the second fusing agent printed can be calibrated based the concentration of fusing material, temperature boosting capacity of the fusing material, and other factors. In some examples, the amount of second fusing agent printed can be sufficient to contact a fusing material with the entire layer of polymer powder. For example, if each layer of polymer powder is 100 microns thick, then the fusing material can penetrate at least 100 microns into the polymer powder. Thus the fusing materials can heat the polymer powder throughout the entire layer so that the layer can coalesce and bond to the layer below. After forming a solid layer, a new layer of loose powder can be formed, either by lowering the powder bed or by raising the height of the roller and rolling a new layer of powder.

The entire powder bed can be preheated to a temperature below the melting or softening point of the polymer powder. In one example, the preheat temperature can be from about 10° C. to about 30° C. below the melting or softening point. In another example, the preheat temperature can be within 50° C. of the melting of softening point. In a particular example, the preheat temperature can be from about 160° C. to about 170° C. and the polymer powder can be nylon 12 powder. In another example, the preheat temperature can be about 90° C. to about 100° C. and the polymer powder can be thermoplastic polyurethane. Preheating can be accomplished with one or more lamps, an oven, a heated support bed, or other types of heaters. In some examples, the entire powder bed can be heated to a substantially uniform temperature.

The powder bed can be irradiated with a fusing lamp. Suitable fusing lamps for use in the methods described herein can include commercially available infrared lamps and halogen lamps. The fusing lamp can be a stationary lamp or a moving lamp. For example, the lamp can be mounted on a track to move horizontally across the powder bed. Such a fusing lamp can make multiple passes over the bed depending on the amount of exposure needed to coalesce each printed layer. The fusing lamp can be configured to irradiate the entire powder bed with a substantially uniform amount of energy. This can selectively coalesce the printed portions with fusing materials leaving the unprinted portions of the polymer powder below the melting or softening point.

In one example, the fusing lamp can be matched with the fusing materials in the second fusing agent so that the fusing lamp emits wavelengths of light that match the peak absorption wavelengths of the fusing agents. A fusing agent with a narrow peak at a particular near-infrared wavelength can be used with a fusing lamp that emits a narrow range of wavelengths at approximately the peak wavelength of the fusing agent. Similarly, a fusing agent that absorbs a broad range of near-infrared wavelengths can be used with a fusing lamp that emits a broad range of wavelengths. Matching the fusing agent and the fusing lamp in this way can increase the efficiency of coalescing the polymer particles with the fusing material printed thereon, while the unprinted polymer particles do not absorb as much light and remain at a lower temperature.

Depending on the amount of fusing material present in the polymer powder, the absorbance of the fusing material, the preheat temperature, and the melting or softening point of the polymer, an appropriate amount of irradiation can be supplied from the fusing lamp. In some examples, the fusing lamp can irradiate each layer from about 0.5 to about 10 seconds per pass.

In further examples, methods of fabricating 3D printed heaters having an electrically resistive element can include tuning the resistance of the electrically resistive element to a desired range. As explained above, the electrically resistive element can have the form of a conductive composite with a matrix of fused thermoplastic polymer particles interlocked with a matrix of conductive particles. The resistance of the conductive composite can be tuned in a variety of ways. For example, the resistance can be affected by the type of conductive particles in the conductive fusing agent, the concentration of the conductive particles in the conductive fusing agent, the amount of conductive fusing agent dispensed onto the powder bed, the cross section and length of the resistor, and so on. When the conductive fusing agent is dispensed by ink jetting, the amount of conductive fusing agent dispensed can be adjusted by changing print speed, drop weight, number of slots from which the agent is fired in the ink jet printer, and number of passes printed per powder layer. In certain examples, a conductive composite element can have a resistance from 1 ohm, 5 ohms, or 10 ohms to 50 kilohms, or more. By way of particular example, the conductive composite element can have a predetermined resistance that enables the electrically resistive element to generate a predefined level of heat when an input voltage of a predefined level is applied across the electrically resistive element.

Sufficient conductivity can be achieved by dispensing a sufficient amount of the conductive particles onto the powder bed. For example, the mass of conductive particles per volume of conductive composite can be greater than 1 mg/cm$^3$, greater than 10 mg/cm$^3$, greater than 50 mg/cm$^3$, or greater than 100 mg/cm$^3$. In a particular example, the mass of conductive particles per volume of the conductive composite can be greater than 140 mg/cm$^3$. In further examples, the mass of conductive particles per volume of conductive composite can be from 1 mg/cm$^3$ to 1000 mg/cm$^3$, from 10 mg/cm$^3$ to 1000 mg/cm$^3$, from 50 mg/cm$^3$ to 500 mg/cm$^3$, or from 100 mg/cm$^3$ to 500 mg/cm$^3$.

In certain examples, a smaller amount of conductive particles can be dispensed to achieve surface conductivity, and a larger amount of conductive particles can be applied to achieve bulk conductivity in the conductive composite. Thus, in some examples a smaller amount of conductive fusing agent can be printed on a single layer of polymer particles to form an electrically resistive element that has conductivity across the surface of the layer, i.e., in the x-y plane. In some examples, electrically resistive elements with conductivity in the x-y plane can be formed with a mass of conductive particles per volume of conductive composite that is greater than 1 mg/cm$^3$ or greater than 10 mg/cm$^3$. In further examples, such electrically resistive elements can be formed with a mass of conductive particles per volume of conductive composite from 1 mg/cm$^3$ to 1000 mg/cm$^3$, 10 mg/cm$^3$ to 500 mg/cm$^3$, or 30 mg/cm$^3$ to 200 mg/cm$^3$. However, such electrically resistive elements may not have sufficient conductivity in the z-axis direction, or in other words, through the bulk of the layer. As used herein, the "z-axis" refers to the axis orthogonal to the x-y plane. For example, in 3-dimensional printing methods that use a powder bed that lowers after each layer is printed, the powder bed is lowered in the z-axis direction.

In some examples, an electrically resistive element that is conductive only in the x-y plane can be sufficient. This is the case when the electrically resistive element is formed parallel to the layers of the 3-dimensional printed heater. However, methods according to the present technology can also be used to print electrically resistive elements that are conductive in the z-axis direction. By dispensing a larger amount of conductive fusing agent onto the layer of polymer particles, the conductive fusing agent can penetrate through the layer and conductivity between layers in the z-axis direction can be achieved. In some examples, electrically resistive elements that are conductive in the z-axis direction can be formed with a mass of conductive particles per volume of conductive composite that is greater than 50 mg/cm$^3$ or greater than 100 mg/cm$^3$. In further examples, such electrically resistive elements can be formed with a mass of conductive particles per volume of conductive composite from 50 mg/cm$^3$ to 1000 mg/cm$^3$, 100 mg/cm$^3$ to 1000 mg/cm$^3$, or 140 mg/cm$^3$ to 500 mg/cm$^3$.

In some examples, the amount of conductive particles dispensed onto the powder bed can be adjusted by printing the conductive fusing agent in multiple passes. In one example, a single pass of an inkjet print head can be sufficient to dispense enough conductive particles to achieve surface conductivity. However, in some cases, a single pass is not sufficient to achieve conductivity in the z-axis direction. Additional passes can be applied to increase the amount of conductive particles in the conductive composite. A sufficient number of passes can be used to achieve conductivity in the z-axis direction. In one example, three or more passes can be used to form a conductive composite with conductivity in the z-axis direction. In further examples, the amount of conductive particles dispensed can be adjusted by adjusting the drop weight of the inkjet printhead either through resistor design or by changing firing parameters. Thus, with a greater drop weight, a greater amount of the conductive fusing agent can be printed with each drop fired. However, in some cases jetting too large an amount of conductive fusing agent in a single pass can lead to lower print quality because of spreading. Therefore, in some examples multiple passes can be used to print more of the conductive fusing agent with better print quality.

In a particular example, a 3-dimensional printed heater can be formed as follows. An inkjet printer can be used to print a first pass including printing a conductive fusing agent onto selected first areas of the powder bed and printing a second fusing agent onto selected second areas of the powder bed. A curing pass can then be performed by passing a fusing lamp over the powder bed to fuse the polymer particles and the conductive particles in the conductive fusing agent. Then, one or more additional passes can be performed of printing the conductive fusing agent onto the plurality of sensor areas of the powder bed to increase the amount of conductive particles. Each pass of printing the conductive fusing agent can be followed by a curing pass with the fusing lamp. The number of passes used can depend on the desired conductivity, the contone level of the printing passes (referring to the density of conductive fusing agent per area deposited on each pass), the type of conductive particles in the conductive fusing agent, concentration of conductive particles in the conductive fusing agent, thickness of the layer of polymer powder being printed, and so on.

In another particular example, a 3-dimensional printed heater can be formed as follows. An inkjet printer can be used to print a first pass including printing an activating agent onto selected first areas of the powder bed, printing a conductive fusing agent onto the activating agent printed on the selected first areas, and printing a second fusing agent onto selected second areas of the powder bed. A curing pass can then be performed by passing a fusing lamp over the powder bed to fuse the polymer particles and the conductive particles in the conductive fusing agent. Then, one or more additional passes can be performed of printing the activating agent and the conductive fusing agent onto the plurality of sensor areas of the powder bed to increase the amount of conductive particles. Each pass of printing the activating agent and the conductive fusing agent can be followed by a curing pass with the fusing lamp. The number of passes used can depend on the desired conductivity, the contone level of the printing passes (referring to the density of conductive fusing agent per area deposited on each pass), the type of conductive particles in the conductive fusing agent, concentration of conductive particles in the conductive fusing agent, thickness of the layer of polymer powder being printed, and so on.

In a further particular example, the activating agent may be printed during a separate pass from the pass during which the conductive fusing agent is printed. In a yet further particular example, the activating agent may be printed following printing of the conductive fusing agent. In any of these examples, the activating agent may be printed to interact with the conductive fusing agent, e.g., remove a dispersing agent from the conductive particles in the conductive fusing agent.

Accordingly, the methods of the present technology can be used to make 3-dimensional printed heaters with a plurality of integrated electrically resistive elements that are oriented in any direction. As explained above, an electrically resistive element can be formed in the x-y plane with respect to the layers of the 3-dimensional printed heater using a relatively smaller amount of conductive fusing agent, while electrically resistive elements oriented in the z-axis direction can be formed by using a relatively greater amount of conductive fusing agent on each layer. As previously described, in some examples, one or more of the electrically resistive elements can be oriented at least partially in the z-axis direction with respect to the layers of the 3-dimensional printed heater. As used herein, "at least partially in the z-axis direction" refers to any direction that has at least a non-zero component on the z-axis. Therefore, electrically resistive elements can be formed parallel to the z-axis or diagonal to the z-axis using the methods described herein.

Figure 6:
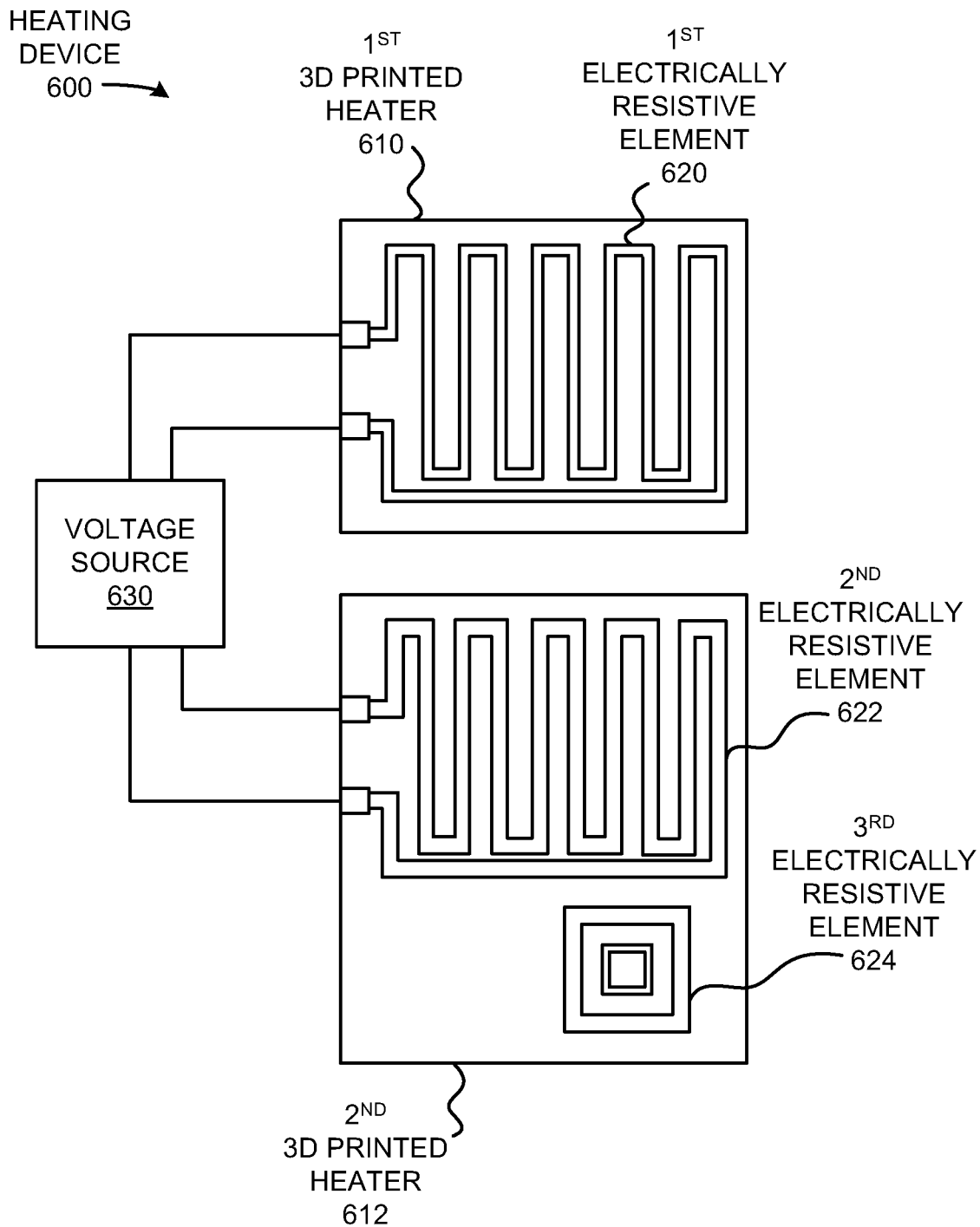
FIG. 6 represents an example of a heating device in accordance with examples of the present disclosure.

The 3-dimensional printing methods described herein can be used to manufacture a wide variety of complex electrically resistive element shapes to be used in a heating device. One example of a heating device 600 is illustrated in FIG. 6. The heating device 600 can include a first 3D printed heater 610 and a second 3D printed heater 612. The first 3D printed heater 610 can include a first electrically resistive element 620 and the second 3D printed heater 612 can include a second electrically resistive element 622 and a third electrically resistive element 624. The heating device 600 can also include a voltage source 630, which may equivalently be construed as a power source, to supply current to the 3D printed heaters 610 and 612. The voltage source 630 may apply the same or different levels of current to the 3D printed heaters 610, 612. The voltage source 630 may apply different levels of current to the 3D printed heaters 610, 612 to, for instance, vary the amount of heat that each of the 3D printed heaters 610, 612 generates during operation.

As shown, the second electrically resistive element 622 may include portions that have relatively wider widths as compared with the first electrically resistive element 620. In one regard, for instance, the second electrically resistive element 622 may generate a greater amount of heat as compared with the first electrically resistive element 620. In addition, the third electrically resistive element 624 may be positioned to direct some of the heat generated by the second electrically resistive element 622 to other another location of the second 3D printed heater 612. That is, as heat may more readily be conducted through the third electrically resistive element 624 as compared with other portions of the second 3D printed heater 612, areas around the third electrically resistive element 624 may be relatively hotter than other areas of the second 3D printed heater 612.

It is noted that, for the sake of simplicity, FIG. 6 illustrates two separate 3D printed heaters 610, 612, in which the first 3D printed heater 610 has one electrically resistive element 620 and the second 3D printed heater 612 has two electrically resistive elements 622, 624. However, other configurations of 3D printed heaters can also be incorporated into a heating device. For example, the electrically resistive elements 620, 622, and 624 may be printed on a single monolithic 3D printed heater 610. An example in which multiple electrically resistive elements 220 are printed on a single 3D printed heater 230 is illustrated in FIG. 2B.

It is noted that, as used in this specification and the appended claims, the singular forms "a," "an," and "the" include plural referents unless the context clearly dictates otherwise.

As used herein, "liquid vehicle" or "agent vehicle" refers to a liquid fluid in which colorant is placed to form an agent. A wide variety of agent vehicles may be used with the systems and methods of the present disclosure. Such agent vehicles may include a mixture of a variety of different agents, including, surfactants, solvents, co-solvents, anti-kogation agents, buffers, biocides, sequestering agents, viscosity modifiers, surface- active agents, water, etc. Though not part of the liquid vehicle per se, in addition to the colorants and fusing agents, the liquid vehicle can carry solid additives such as polymers, latexes, UV curable materials, plasticizers, salts, etc.

As used herein, "colorant" can include dyes and/or pigments.

As used herein, "dye" refers to compounds or molecules that absorb electromagnetic radiation or certain wavelengths thereof. Dyes can impart a visible color to an agent if the dyes absorb wavelengths in the visible spectrum.

As used herein, "pigment" generally includes pigment colorants, magnetic particles, aluminas, silicas, and/or other ceramics, organo-metallics or other opaque particles, whether or not such particulates impart color. Thus, though the present description primarily exemplifies the use of pigment colorants, the term "pigment" can be used more generally to describe not only pigment colorants, but other pigments such as organometallics, ferrites, ceramics, etc. In one specific aspect, however, the pigment is a pigment colorant.

As used herein, "soluble," refers to a solubility percentage of more than 5 wt %.

As used herein, "ink jetting" or "jetting" refers to compositions that are ejected from jetting architecture, such as ink-jet architecture. Ink-jet architecture can include thermal or piezo architecture. Additionally, such architecture can be configured to print varying drop sizes such as less than 30 picoliters, less than 20 picoliters, less than 30 picoliters, less than 40 picoliters, less than 50 picoliters, etc.

As used herein, the term "substantial" or "substantially" when used in reference to a quantity or amount of a material, or a specific characteristic thereof, refers to an amount that is sufficient to provide an effect that the material or characteristic was intended to provide. The exact degree of deviation allowable may in some cases depend on the specific context. When using the term "substantial" or "substantially" in the negative, e.g., substantially devoid of a material, what is meant is from none of that material is present, or at most, only trace amounts could be present at a concentration that would not impact the function or properties of the composition as a whole.

As used herein, the term "about" is used to provide flexibility to a numerical range endpoint by providing that a given value may be "a little above" or "a little below" the endpoint. The degree of flexibility of this term can be dictated by the particular variable and determined based on the associated description herein.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include individual numerical values or subranges encompassed within that range as if each numerical value and sub-range is explicitly recited. As an illustration, a numerical range of "about 1 wt % to about 5 wt %" should be interpreted to include not only the explicitly recited values of about 1 wt % to about 5 wt %, but also include individual values and sub-ranges within the indicated range. Thus, included in this numerical range are individual values such as 2, 3.5, and 4 and sub-ranges such as from 1-3, from 2-4, and from 3-5, etc. This same principle applies to ranges reciting only one numerical value. Furthermore, such an interpretation should apply regardless of the breadth of the range or the characteristics being described.

As a further note, in the present disclosure, it is noted that when discussing the 3D printed heaters, the method of fabricating 3D printed heaters, or a heating device containing a 3D printed heater, each of these discussions can be considered applicable to each of these examples, whether or not they are explicitly discussed in the context of that example. Thus, for example, in discussing details about the 3D printed heaters per se, such discussion also refers to the method and the heating device, and vice versa.

EXAMPLES

The following illustrates examples of the present disclosure. However, it is to be understood that the following are only illustrative of the application of the principles of the present disclosure. Numerous modifications and alternative devices, methods, and systems may be devised without departing from the spirit and scope of the present disclosure. The appended claims are intended to cover such modifications and arrangements.

Example 1

A 3D printed heater may include an electrically resistive element printed on a surface of a part body. A conductive fusing agent, activating agent, and second fusing agent may be printed from three separate ink jet pens. The conductive fusing agent may be a silver ink (Mitsubishi NBSIJ-MU01) containing silver nanoparticles. The silver nanoparticles may have an average particle size of approximately 20 nm. The activating agent may be a solution of 3 wt % sodium chloride in water. The second fusing agent may include carbon black as the fusing material and an aqueous agent vehicle.

The agents may be jetted onto a bed of nylon (PA12) particles (Vestosint® x1556). The nylon particles may have an average particle size of approximately 50 µm. The layer thickness was approximately 100 µm. Each layer may be printed with the activating agent followed by the silver ink in the portions that make up the electrically resistive element, and the carbon black fusing material in the insulating portions. The agents may be printed at contone levels of 255 for the silver ink, 255 for the activating agent, and 15 for the carbon black fusing material. Three passes of the agents may be performed for each layer. After each pass with the agents, a curing pass may be performed. In this example, the amount of solid silver dispensed onto the powder may be about 141 mg/cm$^3$ of the powder layer; the amount of chloride salt dispensed may be 23 mg/cm$^3$ of the powder layer; and the amount of carbon black dispensed may be 2.3 mg/cm$^3$ of the powder layer.

The printer powder supply and powder bed may be filled with the nylon particles. The supply temperature may be set at around 110° C. and the print bed temperature may be set at 130° C. A heater under the print bed may be set at 150° C. The print speed may be set at 10 inches per second (ips) and the cure speed may be set at 7 ips. Curing may be performed using two 300 W bulbs placed approximately 1 cm away from the surface of the powder bed.

A first electrical contact and a second electrical contact of the electrically resistive element may be electrically connected to a power supply (voltage source). The power supply may be activated to apply a current through the electrically resistive element, which may cause the electrically resistive element to generate heat.

Example 2

The 3D printed heater in this example may be prepared using the same 3D print materials and 3D print processes as in Example 1. However, in this example, the electrically resistive element may be printed such that the electrically resistive element may be embedded within a part body. Additionally, electrical contacts that extend outside of the part body may be used to connect the electrically resistive element to a power source.

Although described specifically throughout the entirety of the instant disclosure, representative examples of the present disclosure have utility over a wide range of applications, and the above discussion is not intended and should not be construed to be limiting, but is offered as an illustrative discussion of aspects of the disclosure.

What has been described and illustrated herein is an example of the disclosure along with some of its variations. The terms, descriptions and figures used herein are set forth by way of illustration only and are not meant as limitations. Many variations are possible within the spirit and scope of the disclosure, which is intended to be defined by the following claims—and their equivalents—in which all terms are meant in their broadest reasonable sense unless otherwise indicated.

What is claimed is:

1. A three-dimensional (3D) printed heater comprising:
   a part body formed of fused thermoplastic polymer particles and a conductive fusing agent capable of absorbing energy from electromagnetic radiation;
   an electrically resistive element formed of a matrix of conductive particles interspersed between a matrix of the fused thermoplastic polymer particles of the part body, wherein the conductive particles and the fused thermoplastic polymer particles are provided at respective densities to cause the electrically resistive element to have a predetermined resistance level; and
   electrical contacts connected to the electrically resistive element, wherein a current is to be applied through the electrically resistive element via the electrical contacts to cause the electrically resistive element to generate a predefined level of heat.

2. The 3D printed heater according to claim 1, wherein the electrically resistive element has a resistance level that is to cause the electrically resistive element to generate the predefined level of heat when an input voltage is applied across the electrically resistive element.

3. The 3D printed heater according to claim 1, wherein the electrically resistive element is formed on a surface of the part body.

4. The 3D printed heater according to claim 1, wherein the electrically resistive element is embedded in the part body and the electrical contacts are exposed outside of the part body.

5. The 3D printed heater according to claim 1, wherein the conductive particles comprise conductive polymers, metals, carbon allotropes, or a combination thereof.

6. The 3D printed heater according to claim 1, wherein the fused thermoplastic polymer particles comprise a fusing agent selected from the group consisting of carbon black, a near-infrared absorbing dye, a near-infrared absorbing pigment, a tungsten bronze, a molybdenum bronze, metal nanoparticles, a conjugated polymer, and combinations thereof.

7. The 3D printed heater according to claim 1, wherein the electrically resistive element further comprises an activating agent in the matrix of conductive particles, the matrix of fused thermoplastic polymer particles, or the activating agent in the matrix of conductive particles and the matrix of fused thermoplastic polymer particles.

8. The 3D printed heater according to claim 1, wherein the part body is formed of multiple layers of fused thermoplastic polymer particles stacked in a z-axis direction, and wherein the electrically resistive element is oriented at least partially in the z-axis direction.

9. The 3D printed heater according to claim 1, wherein the conductive fusing agent includes a conductive polymer.

10. A heating device comprising:
    a part body formed of fused thermoplastic polymer particles and conductive particles;
    an electrically resistive element formed of a matrix of thermoplastic polymer particles interlocked with a matrix of conductive particles, wherein the electrically resistive element is embedded within the part body and has a predetermined resistance level; and
    a voltage source to apply an input voltage across the electrically resistive element, wherein the input voltage is to cause the electrically resistive element to generate a predefined level of heat.

11. The heating device according to claim 10, wherein the part body is formed of multiple layers of fused thermoplastic polymer particles stacked in a z-axis direction, and wherein the electrically resistive element is oriented at least partially in the z-axis direction.

* * * * *